(12) United States Patent
Goorden et al.

(10) Patent No.: US 11,181,835 B2
(45) Date of Patent: Nov. 23, 2021

(54) METROLOGY SENSOR, LITHOGRAPHIC APPARATUS AND METHOD FOR MANUFACTURING DEVICES

(71) Applicants: ASML Netherlands B.V., Veldhoven (NL); ASML Holding N.V., Veldhoven (NL)

(72) Inventors: Sebastianus Adrianus Goorden, Eindhoven (NL); Johannes Antonius Gerardus Akkermans, Waalre (NL); Simon Reinald Huisman, Eindhoven (NL); Tamer Mohamed Tawfik Ahmed Mohamed Elazhary, New Canaan, CT (US)

(73) Assignees: ASML Netherlands B.V., Veldhoven (NL); ASML Holding N.V., Veldhoven (NL)

( * ) Notice: Subject to any disclaimer, the term of this patent is extended or adjusted under 35 U.S.C. 154(b) by 63 days.

(21) Appl. No.: 16/613,551

(22) PCT Filed: Apr. 13, 2018

(86) PCT No.: PCT/EP2018/059595
§ 371 (c)(1),
(2) Date: Nov. 14, 2019

(87) PCT Pub. No.: WO2018/210505
PCT Pub. Date: Nov. 22, 2018

(65) Prior Publication Data
US 2021/0157248 A1 May 27, 2021

(30) Foreign Application Priority Data
May 15, 2017 (EP) .................................... 17171103

(51) Int. Cl.
G03F 7/20 (2006.01)
G03F 9/00 (2006.01)
G01B 11/00 (2006.01)

(52) U.S. Cl.
CPC .......... G03F 9/7088 (2013.01); G01B 11/002 (2013.01); G03F 9/7046 (2013.01); G03F 9/7065 (2013.01)

(58) Field of Classification Search
CPC ... G01B 11/002; G03F 7/70091; G03F 7/701; G03F 7/70575; G03F 7/70633;
(Continued)

(56) References Cited

U.S. PATENT DOCUMENTS 5,072,126 A 12/1991 Progler
6,294,296 B1 9/2001 Weigl
(Continued)

FOREIGN PATENT DOCUMENTS

CN 101526750 A 9/2009
JP 2012-242746 A 12/2012
(Continued)

OTHER PUBLICATIONS

International Search Report and Written Opinion of the International Searching Authority directed to related International Patent Application No. PCT/EP2018/059595, dated Jul. 25, 2018; 11 pages.
(Continued)

*Primary Examiner* — Colin W Kreutzer
(74) *Attorney, Agent, or Firm* — Sterne, Kessler, Goldstein & Fox P.L.L.C.

(57) ABSTRACT

Disclosed is a metrology sensor apparatus comprising: an illumination system operable to illuminate a metrology mark in on a substrate with illumination radiation; an optical collection system configured to collect scattered radiation,
(Continued)

following scattering of the illumination radiation by the metrology mark; and a wavelength dependent spatial filter for spatially filtering the scattered radiation, the wavelength dependent spatial filter having a spatial profile dependent on the wavelength of the scattered radiation. The wavelength dependent spatial filter may comprise a dichroic filter operable to substantially transmit scattered radiation within a first wavelength range and substantially block scattered radiation within a second wavelength range and at least one second filter operable to substantially block scattered radiation at least within the first wavelength range and the second wavelength range.

16 Claims, 6 Drawing Sheets

(58) Field of Classification Search
CPC .... G03F 9/7003; G03F 9/7046; G03F 9/7065; G03F 9/7088
USPC .................. 355/67, 68, 71, 77; 356/399–401
See application file for complete search history.

(56) References Cited

U.S. PATENT DOCUMENTS

| | | |
|---|---|---|
| 6,417,922 B1 | 7/2002 | Dirksen et al. |
| 6,961,116 B2 | 11/2005 | Den Boef et al. |
| 7,330,261 B2 | 2/2008 | Van Haren et al. |
| 7,961,116 B2 | 6/2011 | Reusser et al. |
| 10,372,046 B2 | 8/2019 | Ueda |
| 2003/0123035 A1 | 7/2003 | Neijzen et al. |
| 2006/0072096 A1 | 4/2006 | Chandhok |
| 2009/0002706 A1 | 1/2009 | Weiss et al. |
| 2009/0195768 A1 | 8/2009 | Bijnen et al. |
| 2009/0310113 A1 | 12/2009 | Musa et al. |
| 2012/0062863 A1 | 3/2012 | Bijnen et al. |
| 2013/0141730 A1 | 6/2013 | Quintanilha |
| 2013/0163004 A1 | 6/2013 | Matsumoto |
| 2015/0234290 A1 | 8/2015 | Mathijssen et al. |
| 2015/0355554 A1 | 12/2015 | Mathijssen |
| 2016/0223920 A1 | 8/2016 | Tinnemans et al. |
| 2016/0334715 A1 | 11/2016 | Smilde et al. |
| 2017/0235230 A1 | 8/2017 | Ebert et al. |
| 2017/0336198 A1* | 11/2017 | Adel ................... G01B 11/272 |

FOREIGN PATENT DOCUMENTS

| | | |
|---|---|---|
| WO | WO 2013085389 A2 | 6/2013 |
| WO | WO 2014026819 A2 | 2/2014 |
| WO | WO 2014056708 A2 | 4/2014 |
| WO | WO 2015051970 A1 | 4/2015 |
| WO | WO 2016015955 A1 | 2/2016 |
| WO | WO 2016/104511 A1 | 6/2016 |
| WO | WO 2017036833 A1 | 3/2017 |
| WO | WO 2017097564 A1 | 6/2017 |
| WO | WO 2018114152 A1 | 6/2018 |

OTHER PUBLICATIONS

International Preliminary Report on Patentability directed to related International Patent Application No. PCT/EP2018/059595, dated Nov. 19, 2019; 8 pages.

* cited by examiner

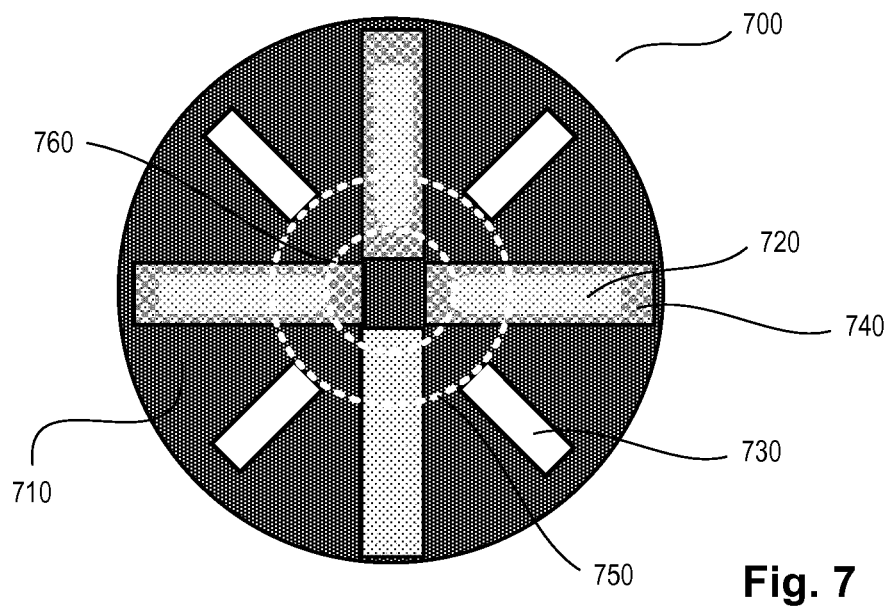
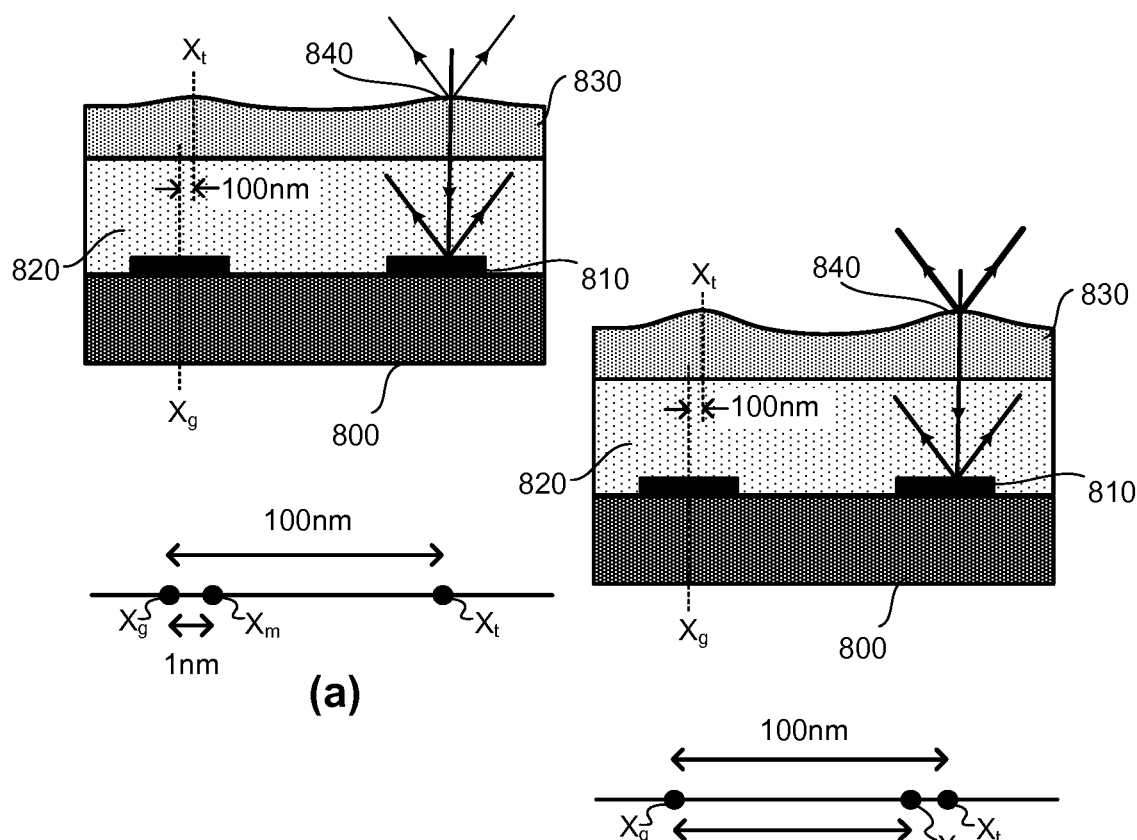
Fig. 8

METROLOGY SENSOR, LITHOGRAPHIC APPARATUS AND METHOD FOR MANUFACTURING DEVICES

CROSS-REFERENCE TO RELATED APPLICATIONS

This application claims priority of EP application no. 17171103.9, which was filed on 15 May 2017 and which is incorporated herein in its entirety by reference.

BACKGROUND

Field of the Invention

The present invention relates to methods and apparatus usable, for example, in the manufacture of devices by lithographic techniques, and to methods of manufacturing devices using lithographic techniques. The invention relates more particularly to metrology sensors and more specifically to position sensors and methods for determining the position of a mark on a substrate.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down (by the same apparatus or a different lithographic apparatus) in previous layers. For this purpose, the substrate is provided with one or more sets of alignment marks. Each mark is a structure whose position can be measured at a later time using a position sensor, typically an optical position sensor. The lithographic apparatus includes one or more alignment sensors by which positions of marks on a substrate can be measured accurately. Different types of marks and different types of alignment sensors are known from different manufacturers and different products of the same manufacturer. A type of sensor widely used in current lithographic apparatus is based on a self-referencing interferometer as described in U.S. Pat. No. 7,961,116 (den Boef et al). Generally marks are measured separately to obtain X- and Y-positions. However, combined X- and Y-measurement can be performed using the techniques described in published patent application US 2009/195768 A (Bijnen et al). Modifications and applications of such sensors are described in US2015355554A1 (Mathijssen), WO20150511070A1 (Tinnemans et al). The contents of all of these publications are incorporated herein by reference.

The application of new layers over the layer containing the alignment marks results in impairment of position signals obtained using the position sensor (or alignment sensor). This can be particularly problematic when at least one of the overlaying layers comprises an opaque material. An example of such a material is amorphous carbon. In order to accurately position device patterns in such a layer, one method may comprise cutting openings in the layer to reveal the underlying alignment marks. These windows can be relatively coarsely positioned, but the accuracy required still presupposes some method to determine the position of the underlying marks.

In current metrology sensors, such as alignment sensors, radiation in the "zeroth diffraction order" (e.g., radiation that is scattered from the edges of the spot mirror, from surface roughness (random scattering), from target edges, etc. which contains no signal information regarding the parameter being measured) which reaches the detector, limits the dynamic range of sensor. The wafer quality (WQ) in these cases may be very low (e.g., 10-6). Wafer quality is a measure (ratio) of the actual alignment signal strength with reference to a signal generated by a fiducial mark. To compensate, the zeroth order stop may be increased in size to block more of the zeroth order scattered light and achieve sufficient wafer alignment performance. However, this may be undesirable due to volume, thermal, vibrational and/or other constraints, such as avoiding blocking of the desired first order diffraction orders, within the alignment sensor module. Another issue is surface scattering into the target diffraction orders, due to residual topography (as well as a contribution from random scattering due to roughness) in the overlaying layer, which causes alignment offsets.

SUMMARY OF THE INVENTION

The present invention in a first aspect aims to provide improved measurement accuracy, particularly at low wafer quality.

The invention in a first aspect provides a metrology sensor system comprising: metrology sensor apparatus comprising: an illumination system operable to illuminate a metrology mark on a substrate with illumination radiation; an optical collection system configured to collect scattered radiation, following scattering of said illumination radiation by said metrology mark; and a wavelength dependent spatial filter for spatially filtering said scattered radiation, said wavelength dependent spatial filter having a spatial profile dependent on the wavelength of said scattered radiation.

In an embodiment said wavelength dependent spatial filter comprises an obscuration for blocking the zero diffraction order of the scattered radiation wherein the effective size of said obscuration is dependent on the wavelength of said scattered radiation. In a further embodiment the effective size of the obscuration is larger for scattered radiation within a first wavelength range relative to scattered radiation within a second wavelength range.

In an embodiment said wavelength dependent spatial filter comprises at least one first filter operable to substantially transmit scattered radiation within the first wavelength range and substantially block scattered radiation within the second wavelength range and at least one second filter operable to substantially block scattered radiation at least within said first wavelength range and said second wavelength range. In a further embodiment the first filter and second filter are optically aligned and the combination of said first filter and said second filter defines a first spatial profile for scattered radiation within the first wavelength range and a second spatial profile for scattered radiation within the second wavelength range.

In an embodiment said first filter comprises a dichroic filter.

In an embodiment the metrology sensor apparatus is operable in at least a first operational phase using illumination radiation within said first wavelength range and a second operational phase using illumination radiation within said second wavelength range. In a further embodiment said first operational phase comprises a coarse positioning phase performed on a first metrology mark and said second operational phase comprises a fine positioning phase performed on a second metrology mark, a pitch of said first metrology mark being larger than a pitch of said second metrology mark. In an embodiment said second filter comprises one or more first apertures for transmitting non-zero diffraction orders in the first operational phase and one or more second apertures for transmitting non-zero diffraction orders in the second operational phase, said one or more first apertures being located closer to an optical axis of the apparatus relative to said one more second apertures, said second filter being substantially in optical alignment with said one or more first apertures, but not in optical alignment with said one or more second apertures.

In an embodiment said second filter comprises one or more apertures for transmitting non-zero diffraction orders of said scattered radiation and said first filter is in optically alignment with an inner portion of each of said one or more apertures.

In an embodiment said second filter comprises a spot mirror for directing the illumination radiation onto the metrology mark.

In an embodiment said illumination radiation comprises a first polarization state; said metrology mark comprises a main structure and being operable to change, relative to said first polarization state, at least one of a polarization state of a first portion of the scattered radiation predominately resultant from scattering by said main structure and a polarization state of a second portion of radiation predominately resultant from scattering by one or more features other than said main structure, such that the polarization state of said first portion of the scattered radiation is different to the polarization state of said second portion of said scattered radiation; and said wavelength dependent spatial filter comprises a polarizing filter operable to substantially filter out said second portion of the scattered radiation based on its polarization state.

In an embodiment said second portion of the scattered radiation predominately comprises radiation having been scattered by at least one or more layers formed over the main structure.

In an embodiment said metrology mark is operable to change the polarization state of said first portion of the scattered radiation to a second polarization state, while not changing the polarization state of said second portion of the scattered radiation such that said second portion of the scattered radiation substantially retains said first polarization state. In a further embodiment said main structure comprises a periodic structure having a first pitch operable to diffract said illumination radiation, said periodic structure being sub-segmented with a second pitch operable to change the polarization state of said first portion of the scattered radiation. In an embodiment said first polarization state is a first circular polarization state and said second polarization state is a second circular polarization state, said second circular polarization state being in an opposite direction as compared to a direction of said first circular polarization state. In a further embodiment said polarization filter comprises at least one quarter-wave plate for converting both the first portion of scattered radiation having said first circular polarization state and the second portion of scattered radiation having said second circular polarization state into mutually orthogonal linear polarization states, enabling their separation.

In an embodiment said first polarization state is a linear polarization state. In a further embodiment said polarization filter is operable to pass only scattered radiation having a polarization state orthogonal to said first polarization state to a processing system. In an embodiment said metrology mark is operable to change the polarization state of said first portion of the scattered radiation to a second polarization state, said second polarization state being orthogonal to said first polarization state.

In an embodiment the metrology sensor system is a position sensor, further comprising at least one processing system and radiation detecting system. In a further embodiment said position sensor comprises a module housing, housing said processing system, and said wavelength dependent spatial filter is located within said module housing.

The invention in a second aspect provides a metrology sensor apparatus operable in at least a first operational phase using illumination radiation within a first wavelength range and a second operational phase using illumination radiation within a second wavelength range, comprising: an illumination system operable to illuminate a metrology mark on a substrate with said illumination radiation; an optical collection system configured to collect scattered radiation, following scattering of said illumination radiation by said metrology mark; and a wavelength dependent spatial filter for spatially filtering said scattered radiation, said wavelength dependent spatial filter having a spatial profile dependent on the wavelength of said scattered radiation and comprising at least one first filter operable to substantially transmit scattered radiation within the first wavelength range and substantially block scattered radiation within the second wavelength range and at least one second filter operable to substantially block scattered radiation at least within said first wavelength range and said second wavelength range; wherein said second filter comprises one or more first apertures for transmitting non-zero diffraction orders in the first operational phase and one or more second apertures for transmitting non-zero diffraction orders in the second operational phase; said one or more first apertures being located closer to an optical axis of the apparatus relative to said one more second apertures; said second filter being substantially in optical alignment with said one or more first apertures, but not in optical alignment with said one or more second apertures; and wherein said wavelength dependent spatial filter comprises a polarizing filter operable to substantially filter out a portion of the scattered radiation based on its polarization state; said polarizing filter being substantially in optical alignment with said one or more second apertures, but not in optical alignment with said one or more first apertures.

The invention also provides for a method of manufacturing devices wherein a device pattern is applied to a substrate using a lithographic process, the method including positioning the applied pattern by reference to measured positions of one or more marks formed on the substrate, the measured positions being obtained using a metrology sensor system of the first aspect.

The invention also provides for a lithographic apparatus for use in applying a pattern to a substrate, the lithographic apparatus including a metrology sensor system of the first or second aspect.

The above and other aspects of the invention will be understood from a consideration of the examples described below.

BRIEF DESCRIPTION OF THE DRAWINGS

Embodiments of the invention will now be described, by way of example only, with reference to the accompanying drawings, in which:

FIG. 7 illustrates an alternative wavelength dependent spatial filter which may be used in an apparatus such as that illustrated in FIG. 5 or 6.

FIG. 8 schematically illustrates the problem of measuring an alignment mark through an overlaying layer with (a) a small surface topography and (b) a relatively larger surface topography;

DETAILED DESCRIPTION OF EMBODIMENTS

Before describing embodiments of the invention in detail, it is instructive to present an example environment in which embodiments of the present invention may be implemented.

Figure 1:
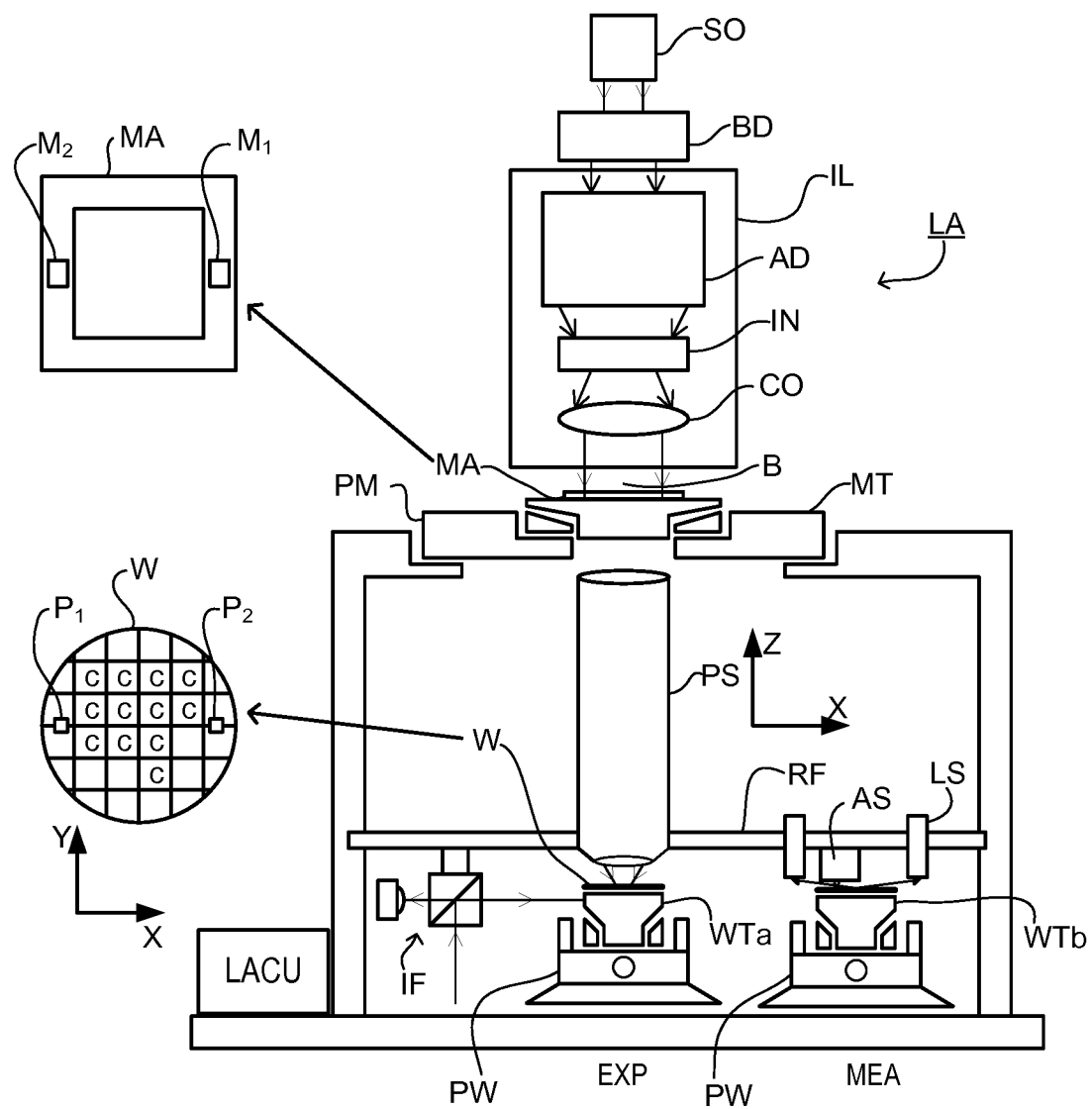
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support MT holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment marks may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
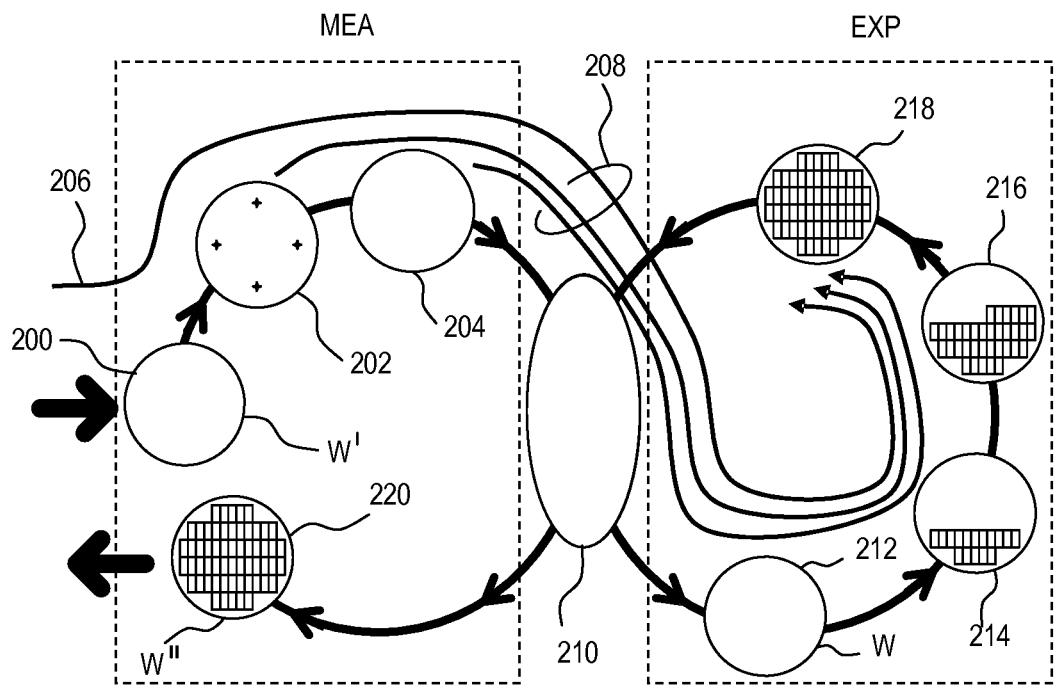
FIG. 2 illustrates schematically measurement and exposure processes in the apparatus of FIG. 1.

FIG. 2 illustrates the steps to expose target portions (e.g. dies) on a substrate W in the dual stage apparatus of FIG. 1. On the left hand side within a dotted box steps are performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a "wafer grid", which maps very accurately the distribution of marks across the substrate, including any distortion relative to a nominal rectangular grid.

At step 204, a map of wafer height (Z) against X-Y position is measured also using the level sensor LS. Conventionally, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the 'ideal' grid, in different dimensions. Advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

The skilled person will know that the above description is a simplified overview of a number of very detailed steps involved in one example of a real manufacturing situation. For example rather than measuring alignment in a single pass, often there will be separate phases of coarse and fine measurement, using the same or different marks. The coarse and/or fine alignment measurement steps can be performed before or after the height measurement, or interleaved.

Presently, optical position sensors, such as alignment sensor AS, use visible and/or near-infrared (NIR) radiation to read alignment marks. In some processes, processing of layers on the substrate after the alignment mark has been formed leads to situations in which the marks cannot be found by such an alignment sensor due to low or no signal strength. A low or zero signal strength can be caused for example by opaque layers on top of the marks which block radiation in the visible/NIR wavelength band, and therefore operation of the alignment sensor. To address this issue, it is known to produce additional marks in subsequent layers to facilitate mark detection. However, the production of these additional marks is expensive. Some processes rely on the production of an optical window on top of the existing marks, in such a way that only the material which is located on top of the marks is removed and therefore the marks can be measured. However, these also require additional processing steps and expense.

Figure 3:
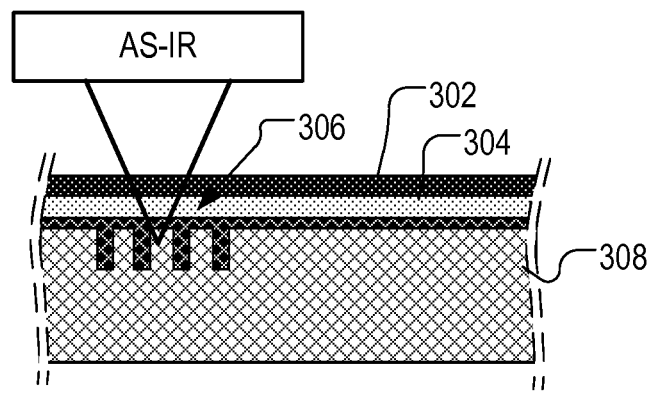
FIG. 3 illustrates schematically the use of a position sensor to measure the position of a target structure formed on a substrate, and a problem of an opaque overlying structure.

FIG. 3 illustrates an alternative solution, based on using an alignment sensor AS-IR which uses a much longer (than normally used) wavelength of radiation that can penetrate an opaque layer 302. The opaque layer 302 is formed over other material layers 304 and alignment mark 306 on substrate 308. Present alignment sensors currently operate at wavelengths between 500-1000 nm. While this wavelength range includes infrared wavelengths near to the visible range, these are unable to penetrate common opaque layers. Transmission through such opaque layers is relatively high for longer IR wavelengths. To mitigate this, an alignment sensor AS-IR which can operate for example using radiation of wavelengths longer than 1000 nm, for example in the range between 1500-2500 nm, may be provided that will be transmitted to a greater extent through such opaque layers. The alignment mark 306 may be a conventional alignment mark, with conventional pitch or may be a special mark with, for example a longer grating pitch, which is better adapted to measurements with these longer wavelengths.

Figure 4:
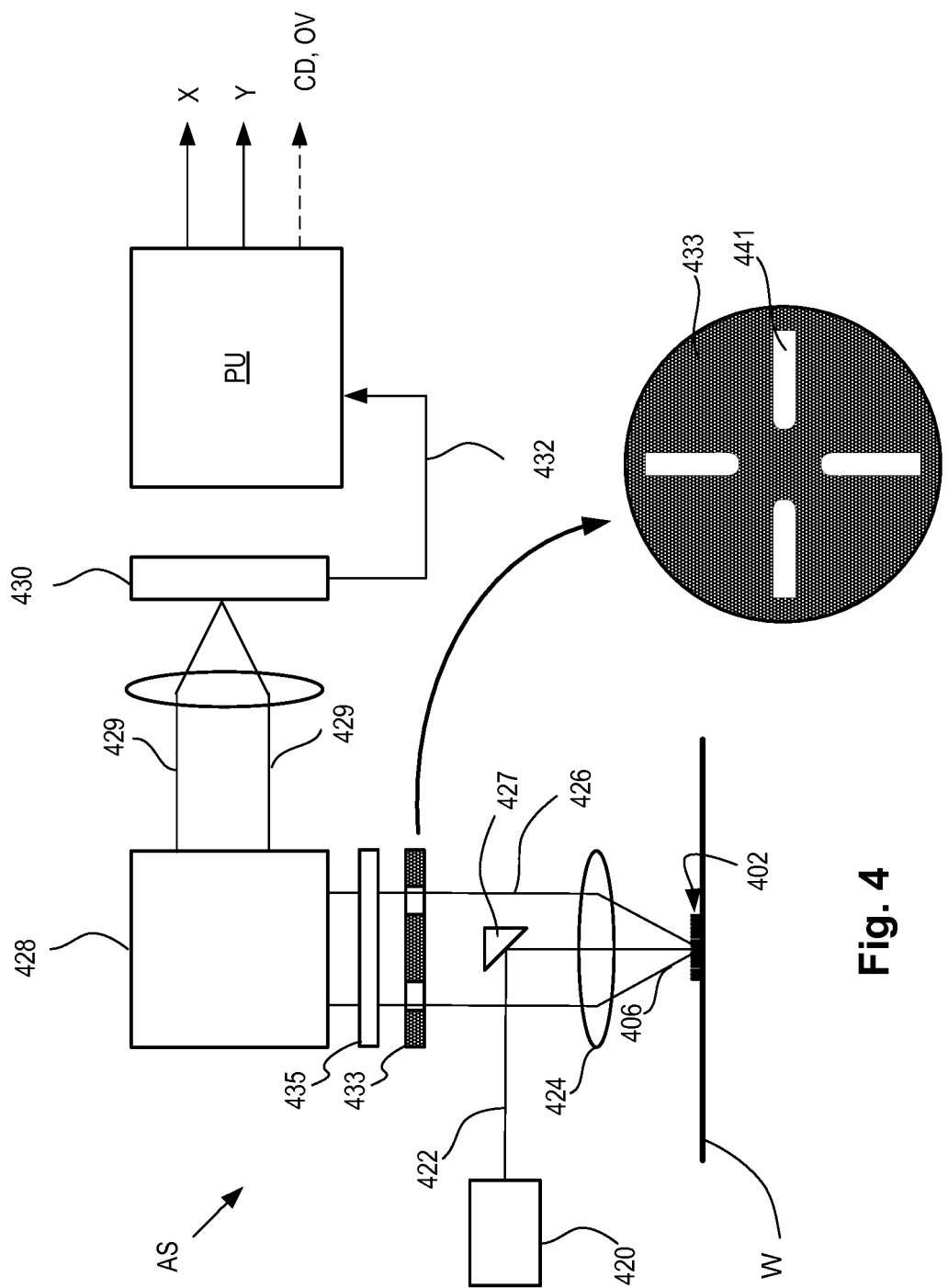
FIG. 4 illustrates schematically a position sensor adaptable according to an embodiment of the present invention.

A simplified, schematic drawing of an example of a position sensor or alignment sensor according to one example of the present disclosure is shown in FIG. 4. Illumination source 420 provides a beam 422 of radiation of one of more wavelengths, which is diverted through an objective lens 424 via a spot mirror 427 onto an alignment mark such as alignment mark 402, located on substrate W. Radiation 406 scattered by alignment mark 402 is picked up by objective lens 424 and collimated into an information-carrying beam 426. An optical analyzer 428 processes beam 426 and outputs separate beams 429 onto a detection system (e.g., sensor array) 430 (e.g., via an optical fiber). Intensity signals 432 from individual sensors in detection system 430 are provided to a processing unit PU. By a combination of the optical processing in the system 428 and the computational processing in the unit PU, values for X- and Y-position on the substrate relative to the sensor are output. Alternatively, or in addition, other parameters may be measured such as overlay OV and/or critical dimension CD.

Detail of the construction and operation of such an alignment sensor can be found in the prior patent publications mentioned in the introduction, and will not be repeated here. Briefly, in the illumination path 422 there may be provided a plurality of individual wavelength sources such as LEDs or laser sources. The sources may be arranged to supply different wavelengths of radiation, for example one or more of green and red visible light, near infrared (NIR) wavelengths and/or infrared radiation in the range 1500-2500 nm, optionally including a wavelength having a wavelength longer than 2000 nm. Sources can include LEDs, lasers, gas discharge sources, plasma sources, supercontinuum sources and inverse Compton scattering sources.

Radiation 426 reflected and diffracted by the alignment mark 402 is collected by the objective lens 424. While the collected radiation 426 is illustrated as a single beam on the optical axis, this information carrying beam is actually spread out by scattering and diffraction. An axial component representing a noise signal is at least partially blocked by the spot mirror 427, which thus acts as an obscuration or obscuration for blocking some of this noise signal. The remaining higher order diffracted radiation (and some stray noise signal) then enters a processing system 428, optionally via an obscuration (spatial filter or pupil filter) 433.

Spatial filter 433 controls which portions of the reflected and diffracted radiation are admitted into the processing system, additional to any spatial filtering provided by the spot mirror 427 and natural aperture of the objective lens 424. In particular, the spot mirror may be insufficiently sized to sufficiently suppress the zero order radiation. In the embodiment shown, spatial filter 433 comprises apertures 441 for passing only the desired corresponding non-zero diffraction orders (e.g., at least the +1 and −1 diffraction orders) in both the X and Y directions. The central region is opaque and, as such, acts as an additional zero-order block which blocks stray radiation not blocked by spot mirror 427. However, this zero-order suppression may still be insufficient with increasingly low wafer quality.

The nature of the processing system 428 will depend on the desired performance and the type of mark provided. The processing system 428 may be based on interferometry, or on imaging, or on a combination of techniques. The processing system 428 may be substantially the same type as one another, or they may be completely different types. In the present example, it will be assumed that the processing system is based on interferometry, and comprises a self-referencing interferometer of the type described in the references.

The processing system 428 may comprise a self-referencing interferometer which receives the collected radiation 426. At the entrance of the interferometer 428, a half-wave plate 435 conditions the polarization of the radiation to 45 degrees. The interferometer then processes it in the manner described in the references, interfering the beam with a rotated copy of itself so that opposite diffraction orders interfere constructively and destructively. A polarizing beam splitter separates "sum" and "difference" channels, which provide the position-sensitive optical signals 429 to a detection system 430. The detection system 430 may include for each of the sum and difference channels, photodetectors for obtaining the desired electrical position signals 432. Where the waveband contains multiple wavelengths or wavelength ranges, then wavelength demultiplexers are included in the detection system, and individual photodetectors are provided to obtain an electrical signal 432 for each wavelength or wavelength range.

Due to the very low wafer quality when aligning through opaque layers, signal levels will be orders of magnitude lower than typical alignment sensor signal levels when aligning through transparent layers. Wafer quality is a measure (ratio) of the actual alignment signal strength with reference to a signal generated by a fiducial mark. A corresponding improvement in the suppression of a noise signal is therefore required to achieve acceptable alignment performance. This is particularly the case with fine positioning (e.g., fine wafer alignment FIWA) on alignment marks with a relatively small pitch. At present, there is no good solution for this. As already described, blocking of the noise signal (stray or zero-order radiation) is largely performed by zero-order blocking, by spot mirror 427 and/or spatial filter 433. The larger the size of the zero-order block, the more stray radiation blocked and the smaller the degradation of measurement reproducibility. However, it is undesirable to make any obscuration within the alignment sensor module very large, because it reduces the pitch flexibility of the alignment sensor and, in particular, complicates its coarse positioning (e.g., coarse wafer alignment COWA) ability. The relatively large pitch of the alignment mark 448 used for coarse alignment limits the size of any zero-order block (e.g., spot mirror 427 or spatial filter 433) to ensure that the actual diffraction orders, and therefore the alignment signal, are not blocked (the diffraction angle being relatively small for the larger alignment mark pitch). It is also undesirable to place a movable obscuration, or one having a physical size which can be tuned, inside the alignment sensor module due to the corresponding vibrational and thermal impact.

In order to better suppress the noise signal, it is proposed, in an embodiment, to use a wavelength dependent spatial filter to block radiation within only a selected wavelength range. This wavelength dependent spatial filter is used within a metrology sensor apparatus which uses illumination radiation of different wavelengths for different operational phases (e.g., positioning phases). More specifically, the metrology sensor apparatus may use one or more illumination wavelengths from within a first wavelength range for a first operational phase (e.g., a coarse positioning phase), and use one or more illumination wavelengths from within a second wavelength range for a second operational phase (e.g., a fine positioning phase). In such an embodiment, the wavelength dependent spatial filter may effectively increase the size of a zero-order obscuration for radiation within the second wavelength range, relative to the size of the order obscuration for radiation within the first wavelength range.

Figure 5:
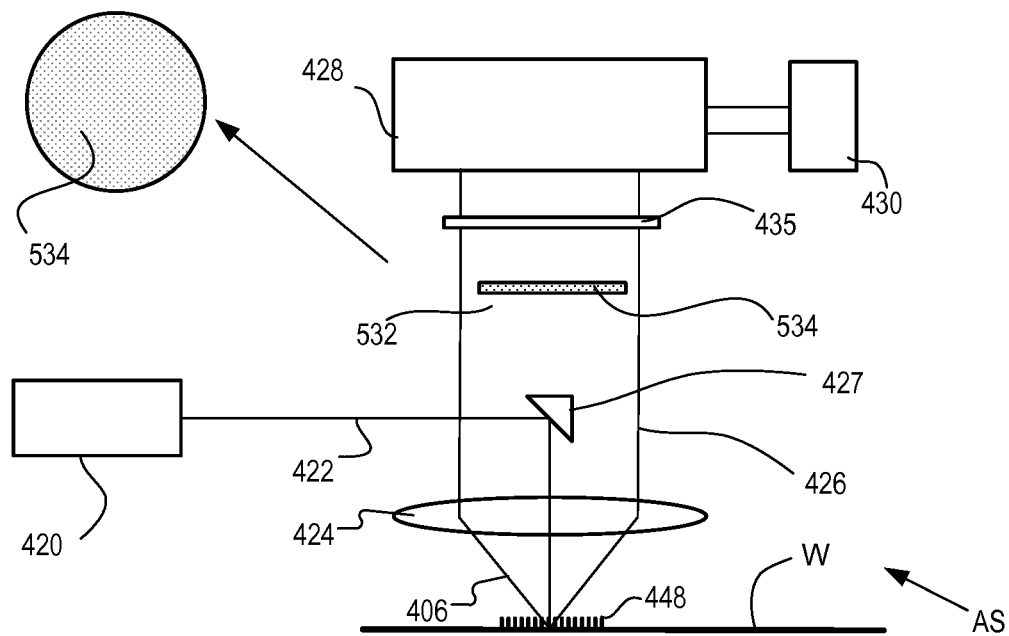
FIG. 5 illustrates schematically the optical system of a position sensor according to a first embodiment of the present invention.

FIG. 5 shows an alignment sensor AS arrangement according to a first embodiment. The main elements of the apparatus are as described in relation to FIG. 4 and will not be discussed further. Of note is the addition of wavelength dependent spatial filter 532 in place of spatial filter 433. In the specific embodiment shown, the wavelength dependent spatial filter 532 comprises a first (wavelength dependent) filter, and more specifically a dichroic filter or mirror 534. The dichroic filter 534 may be operable to be largely transparent to illumination radiation in a first wavelength range, but to block/reflect illumination radiation in a second wavelength range. More specifically, the first wavelength range may correspond to that used during a coarse positioning phase, and the second wavelength range may correspond to that used during a fine positioning phase. In this manner, the dichroic filter 534 has no significant effect during coarse alignment and the spatial filtering (zero-order filtering) is performed only by the spot mirror 427 (second filter). However, during fine alignment, the dichroic filter is opaque to the wavelength used and therefore acts as a larger zero-order block than the spot mirror 427.

Figure 6:
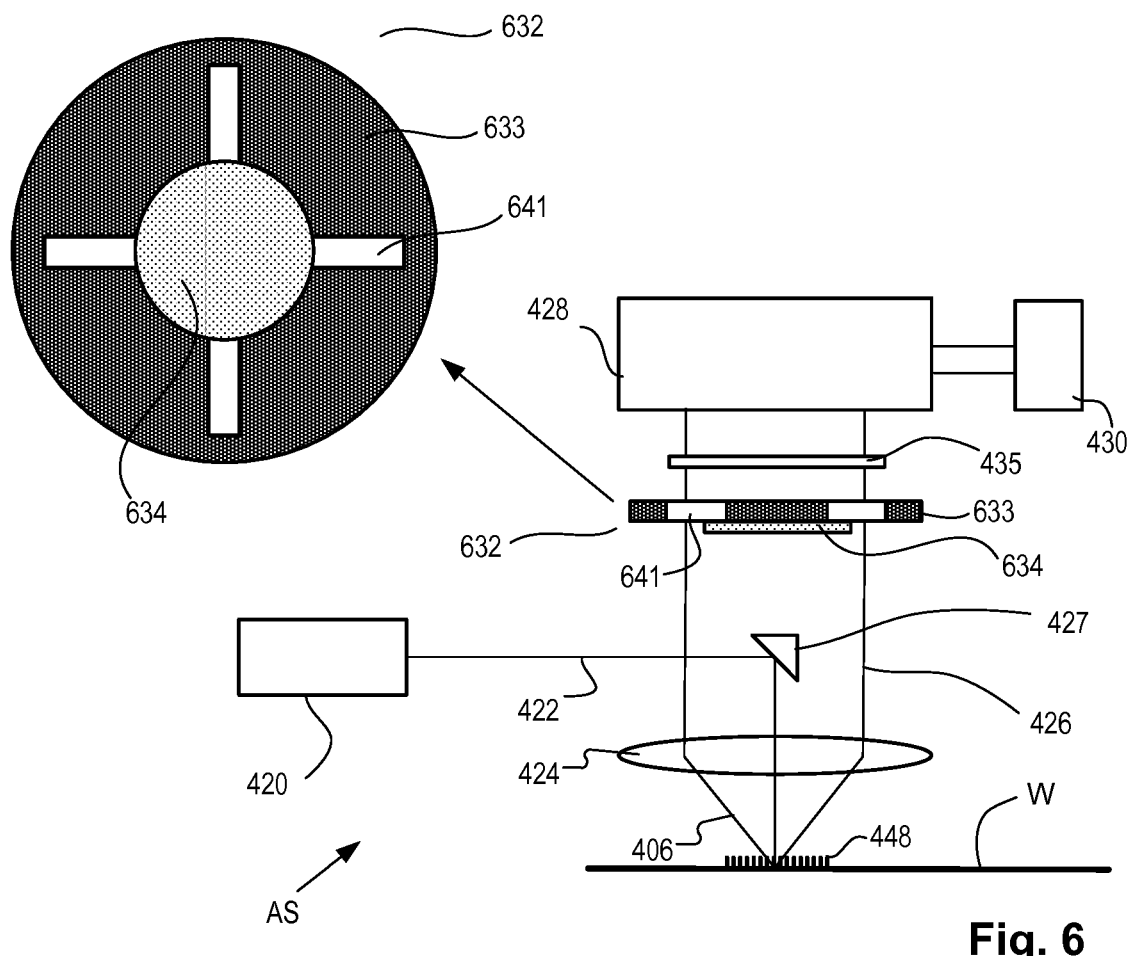
FIG. 6 illustrates schematically the optical system of a position sensor according to a second embodiment of the present invention.

FIG. 6 shows a second exemplary embodiment alignment sensor AS arrangement. In this embodiment, the wavelength dependent spatial filter 632 comprises a first (wavelength dependent) filter, which may comprise a dichroic filter or mirror 634 (essentially similar to dichroic filter 534 as described), in combination with a second filter 633, which is essentially similar to a similar spatial filter 433 as that of the known arrangement of FIG. 4. In the specific embodiment shown, second filter 633 and dichroic filter 634 are in series and coaxial, with the dichroic filter 634 overlapping an inner portion of apertures 641. In this manner, the dichroic filter 634 has no significant effect during coarse alignment and the spatial filtering is essentially the same as that of the arrangement illustrated in FIG. 4. However, during fine alignment, the dichroic filter blocks an inner (relative to the optical axis) portion of apertures 641, effectively decreasing their size and therefore effectively increasing the size of the zero-order block for the fine alignment phase only.

In some apparatuses, fine positioning and coarse positioning are already performed using illumination radiation in different ranges. Fine positioning has a larger position accuracy than coarse positioning. In a specific known system, for example, coarse positioning is performed using illumination radiation within the range 1500-1700 nm and fine positioning is performed using illumination radiation within the range 1700 nm-2000 nm. Therefore, for such apparatuses, the concepts described herein can be incorporated simply by inclusion of wavelength dependent spatial filter 632, for example by incorporating a dichroic filter 634 to second filter 633, which blocks wavelengths in the 1700 nm-2000 nm (or greater) range, but is essentially transparent in the 1500 nm (or smaller)-1700 nm range. In other apparatuses, it may be that the use of different wavelengths for the different operational phases will require implementation.

In general, the concepts described herein relate to the use of a wavelength dependent spatial filter 632 having a profile dependent on the wavelength of the scattered radiation being spatially filtered. More specifically, the concepts described herein relate to a wavelength dependent spatial filter 632 having a dichroic filter 634, as a zero-order obscuration in a metrology device such that it only blocks radiation in a second wavelength range but not in a first wavelength range. Wavelength dependent spatial filter 632 may comprise a dichroic filter 634 integrated with a second filter 633, thereby essentially forming a single filter element. Alternatively dichroic filter 634 and second filter 633 may be spaced apart, or otherwise separate. In embodiments, the dichroic filter may pass radiation of a first wavelength or in a first wavelength range corresponding to a first operational phase but block radiation of a second wavelength or in a second wavelength range corresponding to a second operational phase. In embodiments such a dichroic filter is used in combination with a (e.g., smaller) first spatial filter which substantially blocks radiation in at least the second wavelength range. Or, as already described, there may be no second filter other than spot mirror 427. Of relevance is that the second spatial filter (dichroic filter) effectively increases the size of the zero-order obscuration depending on wavelength.

FIG. 7 illustrates an alternative wavelength dependent spatial filter 700 which can be used in place of wavelength dependent spatial filter 632 in the arrangement of FIG. 6. Wavelength dependent spatial filter 700 comprises a second filter 710 having first apertures 720 and second apertures 730. First apertures 720 are larger than second apertures 730. In embodiments, first apertures 720 and second apertures 730 are in slotted apertures, i.e. substantially rectangular. In particular, the first apertures 720 are located (e.g., begin) closer to the center of second filter 710 than second apertures 730. A first filter or dichroic filter 740 substantially covers first apertures 720.

Such a filter may be used in two operational phases as described before. For example, the two operational phases may comprise a first operational phase, such as a coarse positioning phase, using illumination radiation of one or more wavelengths in a first wavelength range, and a second operational phase, such as a fine positioning phase (providing a larger positioning accuracy than the coarse positioning phase), using illumination radiation of one or more wavelengths in a second wavelength range. However, in this embodiment the non-zero diffraction orders for the two operational phases are rotated within the pupil relative to each other. In the specific example shown, the coarse positioning phase uses first apertures 720 to pass the non-zero diffraction orders via dichroic filter 740 which is operable to pass wavelengths in the first wavelength range and the fine positioning phase uses first apertures 730 to pass the non-zero diffraction orders. In the fine positioning phase, dichroic filter 740 (which may operate similarly to the aforementioned dichroic filter 534, 634) blocks the first apertures 720 from the radiation used in that phase, (e.g., from within the second wavelength range). As the second apertures 730 are (i.e., begin) further away from the center relative to the first apertures 720, this effectively means that the size of the zero-order block (indicated by dotted line 750) is larger during the fine positioning phase relative to the size of the zero-order block (indicated by dotted line 760) during the coarse positioning phase.

It will be appreciated that in this embodiment, the position within the pupil of the non-zero diffraction orders in the first operational phase needs to be spatially rotated relative to the position within the pupil of the non-zero diffraction orders in the second operational phase. In the example shown, this relative rotation is 45 degrees; however this is just an example and the angle of relative rotation may be different. For example, for a 1-dimensional, this relative rotation could be 90 degrees. Any suitable method for rotating the diffraction orders in one or both operational phases so that the diffraction orders are located in different positions in the pupil may be used. In some embodiments, different illumination modes (e.g., different illumination angles) can be used in the two operational phases to achieve this. In another embodiment, the alignment marks 448 (or more generally, metrology marks) could rotate the diffraction orders in one operational phase relative to the other. In the specific example described, the coarse positioning phase could align to an alignment mark with main grating pitch orientated with the relevant direction first apertures 720 (e.g., orientated along the X- or Y-axis) and the fine positioning phase could align to an alignment mark with main grating pitch orientated along the relevant direction second apertures 730 (e.g., a diagonal pitch orientated 45 degrees with the X- or Y-axis).

It will be further understood that the above concepts could be extended to further operational phases or modes. For example, there may be n operational modes, each operational mode using wavelengths(s) from a different wavelength range and there may be a wavelength dependent spatial filter 532, 632, 700 operable to change the size of the zero-order block depending on each operational mode. For example, in the first embodiment described, two or more differently sized dichroic filters in series could be utilized, each with a different pass band corresponding to the wavelength used in a corresponding operational mode. As such, the size of the zero-order stop could be effectively changed between more than two effective sizes depending on the operational mode. Similarly the second embodiment described could be extended to more than two operational modes by having, e.g., third apertures angularly separated in the pupil from the first and second apertures and covered by a further dichroic filter having a different pass band than dichroic filter 740. These third apertures may be spaced a different distance from the filter center (optical axis) relative to distances indicated by dotted lines 750 and 760. Different illumination modes or different metrology targets may be used for each operational mode such that the relevant non-zero diffraction orders are directed to the corresponding apertures for that operational mode. It will be apparent that this can be extended for more than three operational modes, but will ultimately be limited by the available space within the pupil, available wavelength ranges and/or filter pass bands etc.

A second problem when measuring through one or more opaque layers is illustrated in FIG. 8. FIGS. 8(a) and 8(b) each show a first layer 800 comprising an alignment mark of which two individual features 810 (lines) are shown. On this first layer two additional layers are provided: second layer 820 and third layer 830. At least third layer 830 may be opaque, for example. It can be seen that the third layer 830 comprises a topography (roughness or unflatness). There are two main types of surface topography/roughness. A first of these is residual topography. This residual topography typically results from the deposition of material onto the underlying alignment grating without making the top layers perfectly flat. Because of this, residual topography will tend to have the same spatial (grating) structure as the underlying alignment grating. This residual topography will tend to only scatter radiation into the same directions as the alignment grating, e.g., into the $+1^{st}$ and $-1^{st}$ (and possibly higher) diffraction orders. This radiation typically interferes with/ coherently adds to the radiation scattered by the alignment grating, assuming the temporal coherence length of the source is large compared to the stack thickness, which is typically the case. The other main type of surface topography is random surface roughness, which has many/all spatial frequency contributions. In this case, radiation is scattered into all parts of the pupil.

In FIG. 8, the topography peaks 840 illustrated comprise residual topography, although there will also be some random surface roughness present. Although not shown to scale, the topography height (height of the peaks 840 relative to the troughs) may be orders of magnitude smaller in FIG. 8(a) relative to that in FIG. 8(b). Also labelled is the position of an alignment mark (grating) feature (e.g., defining the center position of the grating) $X_g$, the position of a corresponding topography peak $X_t$ and the difference between these positions (100 nm). The alignment mark in such an arrangement may have a first diffraction efficiency. However, the surface (residual) topography may also diffract the measurement beam, essentially acting as a grating. In the specific example shown, this residual topography "grating" may have a diffraction efficiency orders of magnitude smaller than the signal from the actual mark grating (FIG. 8(a)) or orders of magnitude larger than the signal from the actual mark grating (FIG. 8(b)).

Figure 9:
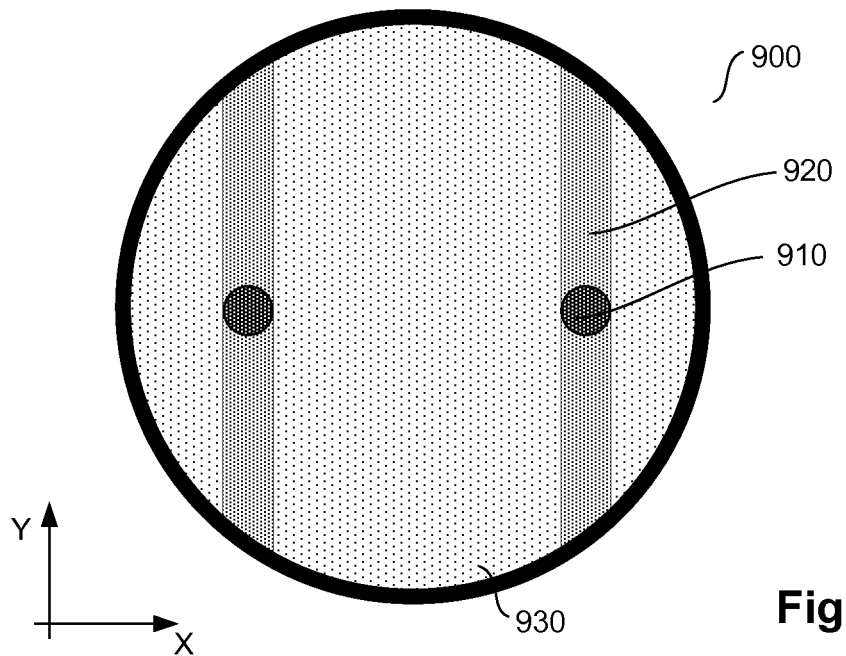
FIG. 9 shows a typical measurement pupil response illustrating the problem of low wafer quality on the measurement pupil.

FIG. 9 shows a typical measurement pupil 1000 resulting from a measurement such as those illustrated in FIG. 8. Regions 910 correspond to the coherent $+1^{st}$ and $-1^{st}$ diffraction orders. The surface scattered radiation resultant from the residual topography travels in the same direction as the grating scattered radiation, i.e., into regions 910, as well as a portion of the radiation scattered by the random surface roughness. This radiation coherently adds to the alignment signal and causes positional (accuracy) errors which depend on one or more of: the position of the surface topography, the vertical distance between grating and roughness, wavelength, pitch, etc. Due to the coherent addition of this radiation to the alignment signal, the measured alignment position is very sensitive to this surface scattering.

The other pupil regions shown 920, 930 relate to the noise signal, e.g., radiation scattered by the random surface roughness to pupil regions other than those corresponding to the main diffraction orders. The portion of the surface scattered radiation scattered to region 930 adds a constant offset to the measured alignment signal. This degrades reproducibility of the alignment position, but does not cause an accuracy (bias) problem. The radiation going into region 930 is spatially separated from the alignment signal and therefore it is this radiation which is blocked using the spatial filter/zero-order stop as described. Region 920 corresponds to surface scattered radiation which travels in the same direction in X as the diffraction orders, but a different direction in Y. This radiation also causes a position (accuracy) but does not add coherently to the alignment signal. Therefore the alignment signal is less sensitive to the radiation scattered into region 920 than it is to radiation scattered into region 910. The effect of this radiation can also be eliminated with a zero-order stop.

Referring back to FIG. 8, the effect of the surface topography, and more specifically the effect of surface scattering into region 910, on a measured position $X_m$, for each example, is shown below the corresponding Figure. In FIG. 8(a), the very small topography results in a significant and problematic alignment error of about 1 nm between the measured position $X_m$ and actual alignment mark position $X_g$, when using illumination radiation of 2000 nm wavelength. In FIG. 8(b), the larger topography (a magnitude in line with that observed in a production environment) results in the topography diffraction becoming dominant and system effectively aligning on the topography rather than the alignment mark. This can result in very large alignment errors, with an error of 99 nm being shown in the specific example of FIG. 8(b).

To address these issues, polarization filtering of the illumination radiation is proposed. It is therefore proposed to tune the combination of illumination polarization state, alignment mark design and/or detection polarization state so as to optimize transmission of the radiation scattered by the alignment mark while filtering out the radiation scattered by the surface topography.

This may be achieved by using polarization changing structures, more specifically polarization changing alignment marks ("polar alignment marks") which, in addition to diffracting the incoming radiation, also act to change the polarization state of the incoming radiation (the illumination polarization state). These polar alignment marks can be used to alter the polarization state of the radiation scattered (diffracted) by the alignment mark (to a second polarization state) relative to that of the radiation scattered by the surface topography. In this way, the radiation scattered by the surface topography, which will tend to retain a first polarization state (the illumination polarization state) can be filtered out using polarization filtering, for example by using a suitable polarization filter which filters based on polarization state. The polarization filter may comprise, for example, a polarizer which acts to substantially block radiation having the illumination polarization state or polarizing beam splitter which acts to separate radiation having the illumination polarization state from the scattered radiation. The polarization filter may further comprise wave plate devices for changing the polarization angle to an angle more suitable for processing. In embodiments, the polarizing filter may be integrated with the wavelength dependent spatial filter, thereby essentially forming an integrated polarization filter and wavelength dependent spatial filter element. Alternatively they may be spaced apart, or otherwise separate.

Figure 10:
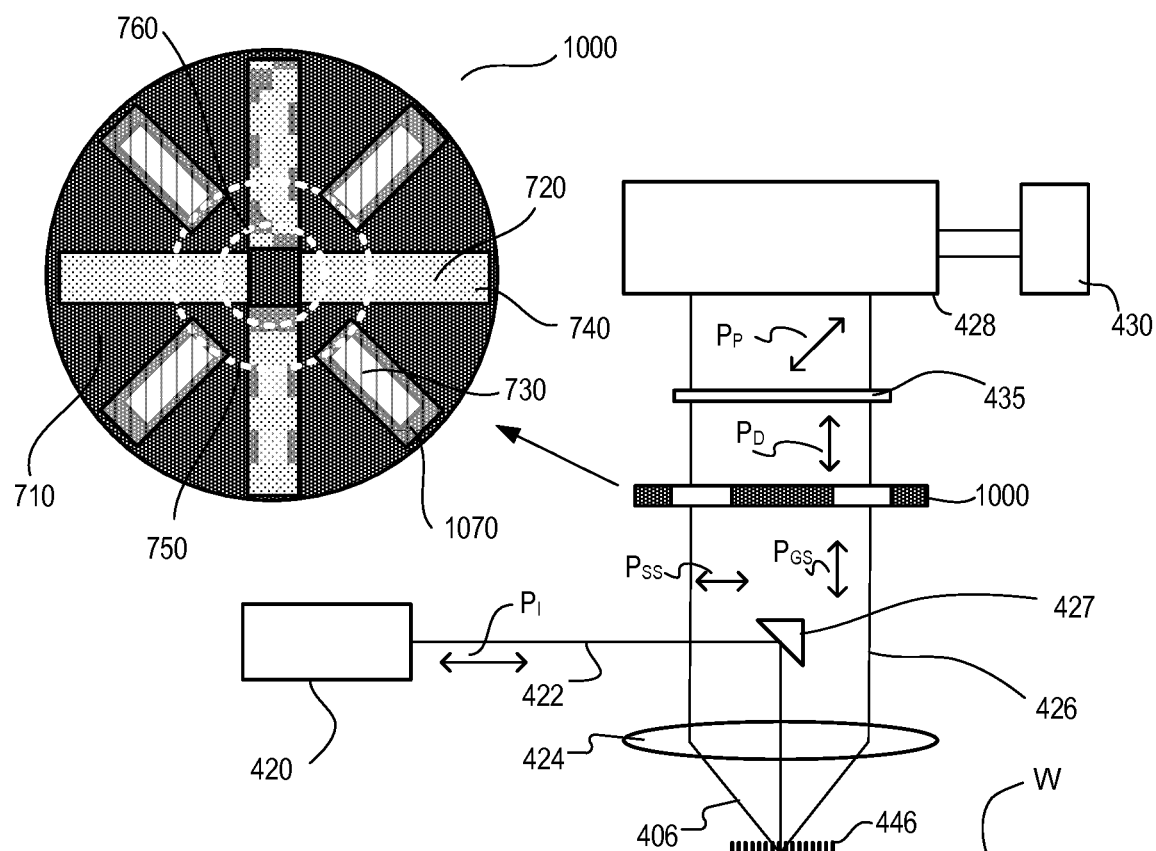
FIG. 10 illustrates schematically the optical system of a position sensor according to further embodiments of the present invention.

FIG. 10 shows an alignment sensor AS arrangement according to a further embodiment. The main elements of the apparatus are as described in relation to FIG. 6, and will not be discussed further. What is of note is that the filtering is performed using a wavelength dependent spatial filter 1000 similar in principle to wavelength dependent spatial filter 700 illustrated in FIG. 7 (rather than wavelength dependent spatial filter 632), but with the addition of polarization filters or polarizers 1070 covering second apertures. In the specific embodiment shown, polarizers 1070 are arranged to pass only radiation with a vertical polarization state which is then processed by processing system 428.

The illumination radiation 422 in this embodiment comprises an illumination (first) polarization state $P_I$, which here is a horizontal polarization. This is scattered by a suitable polar alignment mark 446 which acts to rotate the polarization of the scattered radiation. Note that in this embodiment, the polar alignment mark may also tend to angularly rotate (spatially) the position of the diffraction orders 45 degrees to correspond spatially with second apertures 730 (alternatively this may be achieved by altering the illumination mode/angle). The resultant scattered (e.g., diffracted) radiation 426 will comprise a first portion of scattered radiation which is the desired, grating scattered radiation from the grating structure of the polar alignment mark 446 and a second portion of scattered radiation which is the undesired, surface scattered radiation from the surface topography. The action of the polar alignment mark on the polarization state means that a first portion of scattered radiation, hereafter referred to as the grating scattered radiation, will have a (second) grating scattered polarization state $P_{GS}$ relative to the (first) illumination polarization state $P_I$. In the example shown the grating scattered polarization state $P_{GS}$ has been rotated 90 degrees to a vertical polarization state. Note that the coordinate systems for the polarization arrows differ from that of the rest of the drawing for clarity. As such "vertical" polarization may actually refer to a polarization direction out of plane of the page. In any case, the actual polarization direction is not important and the grating scattered polarization state $P_{GS}$ may equally be a diagonal polarization state, or another polarization state (linear or otherwise) different from that of the illumination polarization state $P_I$. In reality, due to the imperfect nature of the polar alignment mark, grating scattered polarization state $P_{GS}$ will be more elliptical than the linear vertical polarization state illustrated. Due to the nature of the (relatively shallow) surface topology, the second portion of scattered radiation, hereafter referred to as surface scattered radiation, will tend not to have any change in polarization state, such that the surface scattered polarization state $P_{SS}$ will be substantially similar to illumination polarization state $P_I$ (illustrated here as a horizontal polarization state).

The effect of the polarization filter 1070 is to pass radiation having detection polarization state $P_D$ (second polarization state), this detection polarization state $P_D$ being orthogonal to said illumination polarization state $P_I$. As such, illumination polarization state $P_I$ and detection polarization state $P_D$ comprise mutually orthogonal linear polarization states. The polarizer 1070 therefore substantially blocks all of the surface scattered radiation (having surface scattered polarization state $P_{SS}$, substantially similar to illumination polarization state $P_I$) while passing at least some of the grating scattered radiation (having grating scattered polarization state $P_{GS}$, substantially similar to detection polarization state $P_D$) for processing by processing system 428. It should be immediately apparent that the illustrated direction of the horizontal and vertical states in the Figure is completely arbitrary and can be switched.

In another embodiment, the illumination polarization $P_I$ and detection polarization $P_D$ may comprise mutually orthogonal diagonal polarizations. The skilled person will readily appreciate how to implement such a variation, e.g., by rotating the polarizations state of the radiation emitted by illumination source 420 and the direction of polarizing filter 1070 by 45 degrees. As such, half-wave plate 435, which converts the detection polarization state $P_D$ to a diagonal polarization state Pp more suitable for processing (e.g., by a self-referencing interferometer) will therefore not be required.

In yet another embodiment, the illumination polarization state $P_I$ may comprise a first circular polarization state, with the alignment mark configured to change this first polarization state such that the grating scattered polarization state $P_{GS}$ is a second circular polarization state, opposite to the first circular polarization state (clockwise versus anticlockwise or vice versa). A quarter-wave plate can then convert the first circular polarization state (i.e., surface scattered polarization state $P_{SS}$) and the second circular polarization state (i.e., grating scattered polarization state $P_{GS}$) into mutually orthogonal linear polarization states, enabling their separation by polarizing filter 1070.

In an embodiment, the polar alignment mark may comprise a sub-segmented grating formed in one or more layers. Such a sub-segmented grating comprises a first grating pitch having an order of order magnitude similar to that of the wavelength of the illumination radiation, and therefore operable to diffract the illumination radiation. Each element of the grating may be further segmented with sub-structures having a sub-wavelength pitch, much smaller than the wavelength of the illumination radiation. This sub-wavelength pitch should be sufficiently small as not to diffract the illumination radiation; however it will cause the polarization state of the scattered radiation to be altered relative to the illumination radiation. Such polar alignment marks are known and will not be described further. The direction of the sub-segmentation pitch will determine the direction in the polarization imparted to the scattered radiation. The angle of the sub-segmentation pitch will determine the angle through which the polarization is rotated. Greater efficiency (e.g., increased degree of polarization from 45 degrees to 90 degrees) can be achieved with a structure such as alignment mark 446b, where there are (orthogonal) sub-segmented lines (or other features) in each of the "lines" and "spaces" of the main diffraction grating pitch. In this manner, more illumination radiation will have its polarization state altered to a desired polarization state. Note that the terms "line" and "space" are used as per grating convention and do not necessarily comprise literal lines and spaces, but (for example) regions of otherwise contrasting material. Note, where the spatial rotation is also performed by the polar alignment mark, the degree and direction of this spatial rotation is determined by the angle of the first pitch.

It is proposed that the apparatus of FIG. 10 be used in the two operational phases (e.g., coarse positioning phase and fine positioning phase) already described. The coarse positioning phase comprises measuring coarse alignment marks which do not substantially change the polarization state of the scattered radiation. In many applications, the coarse alignment marks are not formed on the substrate, but rather are located on the substrate stage e.g., on a transmission image sensor plate). As such, these alignment marks are difficult to change and presently do not alter the polarization state. Also, these alignment marks will not have overlaying (opaque) layers and therefore surface scattering is not an issue in any case. Therefore, for coarse alignment, it may be beneficial not to employ polarization filtering as disclosed herein. This means that coarse alignment (e.g., alignment of a wafer stage) can be performed in the present manner using (current) non-polarization changing alignment marks on, e.g., a transmission image sensor (TIS) plate. This simplifies coarse alignment, and means that a significant portion of the signal is not filtered out by the polarization filter. This is preferable as during coarse alignment, it may be that multiple (e.g. $3^{rd}$ and $5^{th}$) diffraction orders need capturing, and therefore sufficiently broad, non-polarization-filtering apertures may be required. The coarse positioning phase is therefore no different in this embodiment as that previously described in relation to FIG. 7. The fine alignment phase is also very similar to that previously described, but it is proposed that measurement in this fine alignment phase is of polar alignment marks, in combination with polarization filter 1070, thereby employing the polarization filtering described. It is the fine alignment marks which are typically formed on the substrate and subject to the surface scattering issue described.

In an alternative to the wavelength dependent spatial filter 1000 used in the example described, polarization filtering may be performed in combination with a wavelength dependent spatial filter similar to wavelength dependent spatial filter 632 described above. In such an embodiment, a polarizing filter as described may cover apertures 641 (in addition to dichroic filter 634 partially covering these apertures 641). The polarizing filtering could be employed in only one operational phase, some operational phases or all operational phases, depending on the form of the alignment marks/metrology marks being measured and whether they change the polarization state of the first portion of scattered radiation relative to the second portion of scattered radiation.

It should be appreciated that, in any of the embodiments described above, where it is stated that a polarizing device substantially transmits radiation of a particular polarization state, this should be understood to be relative to a blocked polarization state, and it may be that there is some attenuation at that transmitted polarization state. Similarly there may be some attenuation in the transmitted wavelength range of a dichroic filter.

It should be appreciated that the embodiments of wavelength dependent spatial filter are exemplary. Many other variations of wavelength dependent spatial filter which effectively increase the size of the zero-order obscuration (e.g., an obscuration on the optical axis) depending on wavelength can be envisaged. While the illustrated filters enable diffraction orders to be captured in two orthogonal directions, this is not essential and other embodiments may use a 1-dimensional wavelength dependent spatial filter which, for example, may comprise apertures in only one direction (e.g., only in X or only in Y). Where the first spatial filter and/or second spatial filter is shown as a single filter element, it may equally comprise a plurality of discrete filter elements. Similarly, where the first spatial filter and/or second spatial filter is shown as a plurality of discrete filter elements it may instead comprise a single filter element.

The proposed wavelength dependent spatial filter can be placed within an alignment sensor module without blocking non-zero diffraction orders when measuring relatively large pitch gratings. Further, the proposed wavelength dependent spatial filter does not have moving parts so there will be no thermal or vibrational impact on its use.

There are many possible implementations within the principles of the present disclosure other than those specifically described and illustrated. The principles of the present disclosure can be applied to other types of metrology sensors, not only alignment sensors, and metrology sensors with self-referencing interferometers, or interferometers more generally. The metrology marks may comprise alignment marks, or more generally other target types, depending on metrology application, and may differ from the form and principles shown. For example a metrology mark may be formed in more than one layer, for example for measuring overlay. While the metrology mark is described as having a main structure which is periodic (e.g., a grating), it may instead comprise a non-periodic main structure. While the embodiments above relating to polarization filtering describe the metrology mark changing the polarization state of the first portion relative to the second portion, it may instead be operable to change the second portion relative to the first portion or to change both portions to different polarization states. The wavelength range(s) can be different to the examples given above. For future applications, extension of the sensing wavelengths into ultraviolet wavelengths may be considered, for example. The principles of the present disclosure can be used in combination with other techniques, including those introduced in the prior patents and patent applications mentioned in the introduction.

While specific embodiments of the invention have been described above, it will be appreciated that the invention may be practiced otherwise than as described.

While the example structures described above as metrology marks are grating structures specifically designed and formed for the purposes of position measurement, in other embodiments, positions may be measured on structures which are functional parts of devices formed on the substrate. Many devices have regular, grating-like structures. The terms "mark" and "grating structure" as used herein do not require that the structure has been provided specifically for the measurement being performed. An opaque layer is not the only kind of overlying structure that may disrupt measurement of the position of the mark by observing the mark in conventional wavelengths. For example, surface roughness, or a conflicting periodic structure, may interfere with measurement at one or more wavelengths.

In association with the position measuring hardware and suitable structures realized on substrates and patterning devices, an embodiment may include a computer program containing one or more sequences of machine-readable instructions implementing methods of measurement of the type illustrated above to obtain information about the position of the mark covered by an overlying structure. This computer program may be executed, for example, by a processor or the like which is dedicated to that purpose, or is integrated in the control unit LACU of FIG. 1. There may also be provided a data storage medium (e.g., semiconductor memory, magnetic or optical disk) having such a computer program stored therein.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

The breadth and scope of the present invention should not be limited by any of the above-described exemplary embodiments, but should be defined only in accordance with the following claims and their equivalents.

The invention claimed is:

1. A metrology sensor apparatus comprising:
an illumination system configured to illuminate a metrology mark on a substrate with illumination radiation;
an optical collection system configured to collect scattered radiation, following a scattering of the illumination radiation by the metrology mark; and
a wavelength dependent spatial filter configured to spatially filter the scattered radiation, wherein the wavelength dependent spatial filter comprises an obscuration configured to block a zero diffraction order of the scattered radiation and wherein the wavelength dependent spatial filter has a spatial profile dependent on the wavelength of the scattered radiation by an effective size of the obscuration being dependent on the wavelength of the scattered radiation.

2. The metrology sensor apparatus of claim 1, wherein the effective size of the obscuration is larger for scattered radiation within a first wavelength range relative to scattered radiation within a second wavelength range.

3. The metrology sensor apparatus of claim 1, wherein the wavelength dependent spatial filter comprises a first filter configured to substantially transmit scattered radiation within a first wavelength range and substantially block scattered radiation within a second wavelength range and a second filter configured to substantially block scattered radiation at least within the first wavelength range and the second wavelength range.

4. The metrology sensor apparatus of claim 3, wherein the first filter and the second filter are optically aligned and a combination of the first filter and the second filter defines a first spatial profile for the scattered radiation within the first wavelength range and a second spatial profile for the scattered radiation within the second wavelength range.

5. The metrology sensor apparatus of claim 3, wherein the first filter comprises a dichroic filter.

6. The metrology sensor apparatus of claim 3, wherein the metrology sensor apparatus is operable in at least a first operational phase using illumination radiation within the first wavelength range and a second operational phase using illumination radiation within the second wavelength range.

7. The metrology sensor apparatus of claim 6, wherein the first operational phase comprises a coarse positioning phase performed on a first metrology mark and the second operational phase comprises a fine positioning phase performed on a second metrology mark, a pitch of the first metrology mark being larger than a pitch of the second metrology mark.

8. The metrology sensor apparatus of claim 3, wherein:
the second filter comprises one or more apertures for transmitting non-zero diffraction orders of the scattered radiation, and
the first filter is in optical alignment with an inner portion of each of one or more apertures.

9. The metrology sensor apparatus of claim 3, wherein the second filter comprises a spot mirror for directing the illumination radiation onto the metrology mark.

10. The metrology sensor apparatus of claim 1, wherein:
the illumination radiation comprises a first polarization state;
the metrology mark comprises a main structure and is operable to change, relative to the first polarization state, at least one of a polarization state of a first portion of the scattered radiation predominately resultant from scattering by the main structure and a polarization state of a second portion of radiation predominately resultant from scattering by one or more features other than the main structure, such that the polarization state of the first portion of the scattered radiation is different to the polarization state of the second portion of the scattered radiation; and
the wavelength dependent spatial filter comprises a polarizing filter operable to substantially filter out the second portion of the scattered radiation based on its polarization state.

11. The metrology sensor apparatus of claim 10, wherein the second portion of the scattered radiation predominately comprises radiation having been scattered by at least one or more layers formed over the main structure.

12. The metrology sensor apparatus of claim 10, wherein the metrology mark is configured to change the polarization state of the first portion of the scattered radiation to a second polarization state, while not changing the polarization state of the second portion of the scattered radiation such that the second portion of the scattered radiation substantially retains the first polarization state.

13. The metrology sensor apparatus of claim 12, wherein the main structure comprises a periodic structure having a first pitch operable to diffract the illumination radiation, the periodic structure being sub-segmented with a second pitch operable to change the polarization state of the first portion of the scattered radiation.

14. A metrology sensor apparatus operable in at least a first operational phase using illumination radiation within a first wavelength range and a second operational phase using illumination radiation within a second wavelength range, the metrology sensor comprising:
an illumination system configured to illuminate a metrology mark on a substrate with the illumination radiation;
an optical collection system configured to collect scattered radiation, following a scattering of the illumination radiation by the metrology mark; and
a wavelength dependent spatial filter configured to spatially filter the scattered radiation, the wavelength dependent spatial filter having a spatial profile dependent on a wavelength of the scattered radiation and comprising at least one first filter operable to substantially transmit scattered radiation within the first wavelength range and substantially block scattered radiation within the second wavelength range and at least one second filter operable to substantially block scattered radiation at least within the first wavelength range and the second wavelength range,
wherein the at least one second filter comprises one or more first apertures configured to transmit non-zero diffraction orders in the first operational phase and one or more second apertures to transmit non-zero diffraction orders in the second operational phase,
wherein the one or more first apertures is located closer to an optical axis of the apparatus relative to the one more second apertures, wherein the at least one second filter is substantially in optical alignment with the one or more first apertures, but not in optical alignment with the one or more second apertures, wherein the wavelength dependent spatial filter comprises a polarizing filter operable to substantially filter out a portion of the scattered radiation based on its polarization state, and wherein the polarizing filter is substantially in optical alignment with the one or more second apertures, but not in optical alignment with the one or more first apertures.

15. A method of manufacturing devices, comprising:

applying a device pattern to a substrate using a lithographic process;

positioning the applied pattern by reference to measured positions of one or more metrology marks formed on the substrate, the measured positions being obtained using a metrology sensor system, by:

illuminating, using an illumination system, the one or more metrology marks on the substrate with illumination radiation;

collecting, using an optical collection system, scattered radiation, following a scattering of the illumination radiation by the one or more metrology marks; and spatially filtering the scattered radiation, using a wavelength dependent spatial filter, wherein the wavelength dependent spatial filter comprises an obscuration configured to block a zero diffraction order of the scattered radiation and wherein the wavelength dependent spatial filter has a spatial profile dependent on the wavelength of the scattered radiation by an effective size of the obscuration being dependent on the wavelength of the scattered radiation.

16. A lithographic apparatus for use in applying a pattern to a substrate, the lithographic apparatus including a metrology sensor system comprising:

an illumination system configured to illuminate a metrology mark on a substrate with illumination radiation;

an optical collection system scattered radiation, following a scattering of the illumination radiation by the metrology mark; and a wavelength dependent spatial filter for spatially filtering the scattered radiation, wherein the wavelength dependent spatial filter comprises an obscuration configured to block a zero diffraction order of the scattered radiation and wherein the wavelength dependent spatial filter has a spatial profile dependent on the wavelength of the scattered radiation by an effective size of the obscuration being dependent on the wavelength of the scattered radiation.

\* \* \* \* \*